United States Patent [19]

Hagino

[11] Patent Number: 5,391,898
[45] Date of Patent: * Feb. 21, 1995

[54] INSULATED GATE BIPOLAR TRANSISTOR HAVING HIGH SHORT-CIRCUIT AND LATCH-UP WITHSTANDABILITY

[75] Inventor: Hiroyasu Hagino, Itami, Japan

[73] Assignee: Mitsubishi Denki Kabushiki Kaisha, Tokyo, Japan

[*] Notice: The portion of the term of this patent subsequent to Jun. 11, 2008 has been disclaimed.

[21] Appl. No.: 926,378

[22] Filed: Aug. 10, 1992

Related U.S. Application Data

[62] Division of Ser. No. 648,973, Jan. 31, 1991, abandoned, which is a division of Ser. No. 401,827, Sep. 1, 1989, Pat. No. 5,023,691.

[30] Foreign Application Priority Data

May 26, 1989 [JP] Japan .................................. 1-133202

[51] Int. Cl.$^6$ .................... H01L 29/74; H01L 31/111; H01L 23/58; H01L 29/76
[52] U.S. Cl. .................... 257/139; 257/138; 257/142; 257/212; 257/378
[58] Field of Search ................ 257/107, 138, 139, 142, 257/143, 212, 337, 341, 378

[56] References Cited

U.S. PATENT DOCUMENTS

| | | | |
|---|---|---|---|
| 4,441,117 | 4/1984 | Zommer | 257/337 |
| 4,532,534 | 7/1985 | Ford et al. | 257/341 |
| 4,672,407 | 6/1987 | Nakagawa et al. | 257/142 |
| 4,680,604 | 7/1987 | Nakagawa et al. | 257/142 |
| 4,760,431 | 7/1988 | Nakagawa et al. | 257/138 |
| 4,841,345 | 6/1989 | Majumdar | 257/143 |
| 4,881,120 | 11/1989 | Nakagawa et al. | 357/23.4 |
| 4,975,782 | 12/1990 | Bauer | 357/23.4 |
| 4,990,975 | 2/1991 | Hagino | 357/23.4 |
| 5,023,691 | 6/1991 | Hagino | 257/139 |
| 5,170,239 | 12/1992 | Hagino | 257/139 |

FOREIGN PATENT DOCUMENTS

| | | | |
|---|---|---|---|
| 0192229 | 8/1986 | European Pat. Off. | 257/212 |
| 0226148 | 6/1987 | European Pat. Off. | |
| 61-84865 | 4/1986 | Japan | 257/341 |
| 61-164263 | 7/1986 | Japan | 257/142 |
| 62-177965 | 8/1987 | Japan | 257/341 |

OTHER PUBLICATIONS

IEEE Transaction on Electron Device, vol. ED-34, No. 2, Feb. 1987, "Safe Operating Area for 1200-V Nonlatchup Bipolar-Mode MOSFET's" by Nakagawa et al., pp. 351-354.

IEEE Transaction on Electron Device, vol. ED-27, No. 2, Feb. 1980, "A New Bipolar Transistor-GAT" by Kondo et al., pp. 373-379.

1984, IEDM, "Non-latch-up 1200V 75A Bipolar Mode MOSFET with Large ASO" by Nakagawa et al., pp. 860-861.

Extended Abstracts of the 20th (1988 International) Conference on Solid State Devices and Materials, Aug. 24-26, 1988, Tokyo, 1988, pp. 25-28, H. Ohashi, et al.

IEEE Electron Device Letters EDL-6 (1985) Jul., No. 7, New York, "600-and 1200-V Bipolar-Mode MOSFET's with High Current Capability", A. Nakagawa et al.

*Primary Examiner*—Steven H. Y. Loke
*Attorney, Agent, or Firm*—Oblon, Spivak, McClelland, Maier & Neustadt

[57] ABSTRACT

An IGBT has an emitter bypass structure. The interval D between N emitter regions is adapted to be larger than two times of a channel length L in order to effectively decrease a channel width to effectively decrease a saturation current. A high concentration region may be provided in a P base region, which is closer to the end portion of the P base region than the emitter regions between the emitter regions, so that the channel width can be effectively decreased even without the relation of D>2L. A channel width per unit area $W_U$ may be in a range of 140 cm$^{-1}$ ≤ $W_U$ ≤ 280 cm$^{-1}$ in an IGBT of a breakdown voltage class of 500-750 V or 70 cm$^{-1}$ ≤ $W_U$ ≤ 150 cm$^{-1}$ in an IGBT of a breakdown voltage class of 1000-1500 V, so that an IGBT having a short-circuit withstandability and a latch-up withstandability suitable for an inverter can be implemented.

6 Claims, 17 Drawing Sheets

FIG.4A (BACKGROUND ART)
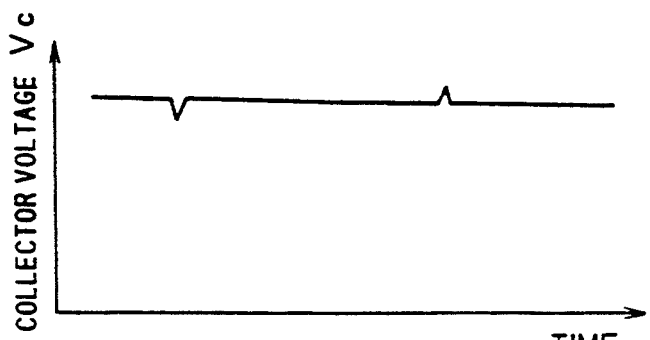
FIG.4B (BACKGROUND ART)
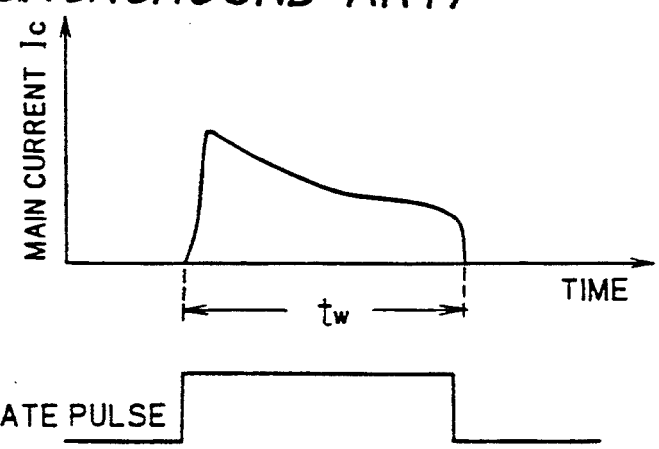
FIG.4C (BACKGROUND ART)
FIG.5 (BACKGROUND ART)
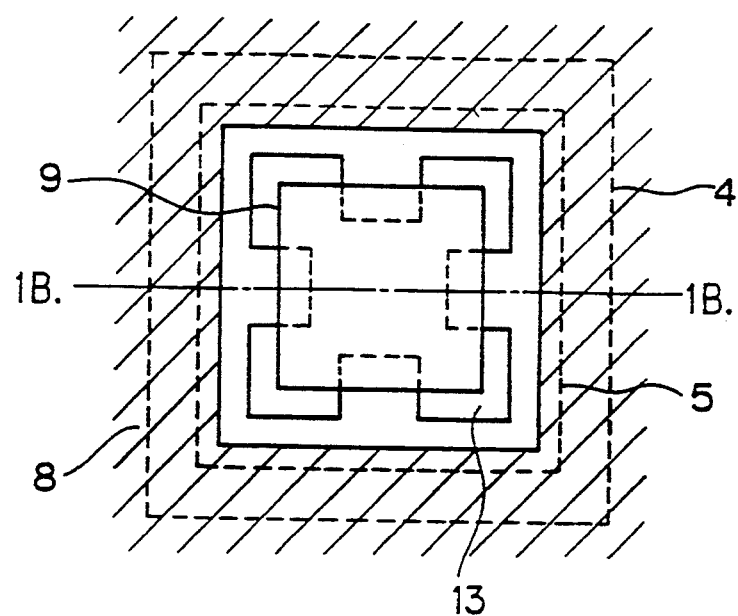

INSULATED GATE BIPOLAR TRANSISTOR HAVING HIGH SHORT-CIRCUIT AND LATCH-UP WITHSTANDABILITY

This application is a division of application Ser. No. 07/648,973, filed on Jan. 31, 1991, now abandoned, which is a division of application Ser. No. 07/401,827, filed on Sep. 1, 1989, now U.S. Pat. No. 5,023,691.

BACKGROUND OF THE INVENTION

1. Field of the Invention

The present invention relates to an insulated gate bipolar transistor (hereinafter referred to as IGBT) and, more particularly, to an IGBT having a high short-circuit withstandability (i.e., high short circuit SOA) and a high latch-up withstandability (i.e., high latch-up current) suitable for an inverter.

2. Description of the Background Art

In general, an IGBT device has a plurality of IGBT elements (hereinafter referred to as IGBT cells) connected in parallel, each of which may have a polygonal configuration, such as a square configuration, or a striped configuration. FIG. 1A is a plan view showing a square IGBT cell in a conventional N channel IGBT device, and FIG. 1B is a sectional view taken along line 1B—1B of FIG. 1A. As best shown in FIG. 1B, the IGBT cell includes a P collector layer 1, and an N+buffer layer 2 and an N epitaxial layer 3 provided on the P collector layer 1 in this sequence. P base regions 4 are selectively formed in the surface of the N epitaxial layer 3 and, further, N emitter regions 5 are selectively formed in the surface of each of the P base region 4. Regions 6 in the vicinity of the surface of the P base region 4, between the surfaces of the N epitaxial layer 3 and N emitter regions 5, are defined as channel regions. Gate insulation films 7 are deposited on the channel regions 6. Each of the insulation films 7 also covers the N epitaxial layer 3 to be integrated in the adjacent IGBT cells. Gate electrodes 8 are formed of substance such as polysilicon on the gate insulation films 7. An emitter electrode 9 is formed of metal such as aluminum to be in electrically contact with both the P base layer 4 and the N emitter regions 5. In the IGBT device, all the gate electrodes 8 of the IGBT cells are electrically connected in common and all the emitter electrodes 9 of the IGBT cells are also electrically connected in common. A collector electrode 10 of metal is formed over the whole bottom surface of the P collector layer 1 to be integrated in all the IGBT cells.

An IGBT is a voltage control type transistor having a MOS gate configuration similar to a MOSFET, so that the IGBT is advantageous because of its simplified drive circuit. When a positive voltage is applied to the gate electrodes 8 under the state where a positive voltage is applied to the collector electrode 10 and a negative voltage is applied to the emitter electrodes 9, inversion layers appear in the channel regions 6 to allow electrons to move into the N epitaxial layer 3 from the N emitter regions 5. On the other hand, holes are injected into the N epitaxial layer 3 from the P collector layer 1 through the N+buffer layer 2 which controls the injection of those holes, so that the conductivity modulation is caused in the N epitaxial layer 3. This results in a significant reduction of resistance in the N epitaxial layer 3. Therefore, an IGBT device has an advantage where an ON state resistance in the N epitaxial layer 3 does not have much effect even in the IGBT device of high breakdown voltage, although an ON state resistance in a layer corresponding to the N epitaxial layer 3 has much effect in a MOSFET device of high breakdown voltage. Because of these advantages, the IGBT has been noted as a device suitable for an inverter.

Meanwhile, as shown in FIG. 1B, there exists a parasitic thyristor formed of the P collector layer 1, the N epitaxial layer 3, the P base regions 4 and the N emitter regions 5 in the IGBT. When the parasitic thyristor once turns on, a voltage applied to the gate electrode 8 can go longer control the main current. This phenomenon is called latch-up. Once latch-up is caused, an excess current results in a thermal breakdown of the IGBT. Accordingly, it is important for the IGBT to have a high latch-up breakdown voltage.

The mechanism of occurrence of a latch-up will be described below. When hole current flows just below the N emitter regions 5, a voltage drop occurs because of resistances R laterally extending in each of the P base regions 4. When this voltage drop becomes higher than the built-in potential in a PN junction formed of the N emitter regions 5 and the P base region 4, the PN junction is forwardly biased so that electrons injected from the N emitter regions 5 to the P base regions 4. This provides trigger and results in latch-up. As the main current $I_C$ is increased, the hole current flowing just below the N emitter regions 5 is increased, so that a latch-up is easily caused. Hence, the IGBT design generally implemented so that $I_L > I_{C(Sat)Max}$ is satisfied, where $I_L$ is the limit of the main current to which latch-up can be avoided and $I_{C(Sat)Max}$ is a saturation current at the maximum gate voltage actually used.

FIG. 2 is a circuit diagram showing an inverter device in which six IGBTs 11a–11f are used as switching elements. In a usual inverter device, when arms are short-circuited, a current sensor 12 detects an excess current to force all the switching elements (the IGBTs 11a–11f in the circuit shown in FIG. 2) to be turned off so as to prevent those switching elements from breaking down. However, since such protecting function does not immediately work, those switching elements come to be subjected to an excess current for some time. Hence, it is important for the IGBT to have a high short-circuit breakdown voltage when it is incorporated into the inverter device as switching element.

In the IGBT shown in FIG. 1B, an electron current flowing in the channel region 6 serves as a base current $I_B$ of a PNP transistor formed of the P collector layer 1, the N epitaxial layer 3 and the P base regions 4. Assuming that $h_{FE}$ represents a current amplification factor of the PNP transistor, the main current $I_C = h_{FE} \times I_B$. No P collector layer 1 is in MOSFET. This means there is no amplification caused by the above mentioned PNP transistor in the MOSFET and, therefore, the above equation should be $I_C = I_B$. Thus, as shown in FIG. 3, a saturation current $I_{C(Sat)}$ of the IGBT, which is restricted by a channel resistance on the condition that a gate voltage is constant, is approximately $h_{FE}$ times as large as that of the MOSFET. The $I_{C(Sat)}$ corresponds to a self-restriction current in short-circuiting.

FIGS. 4(A)–4(C) are diagrams showing a wave form in an IGBT short-circuiting test. Herein, a gate pulse shown in FIG. 4(C) is applied to the Gate electrode 8 with power supply voltage being directly applied across the emitter electrode 9 and the collector electrode 10 of the IGBT without a load. As a result, a large main current $I_C$ ($<I_{C(Sat)}$) flows for a period of time $t_W$, as shown in FIG. 4(B), with a high collector voltage $V_C$ being applied as shown in FIG. 4(A). When $I_C \times V_C \times t_W$ goes beyond a critical value, the IGBT is thermally broken down. This critical value is determined depending upon the area of an IGBT chip, the resistance value and the thickness of the N epitaxial layer 3 and the like. It is preferable that $I_{C(Sat)}$ is as small as possible, in order to enhance the short-circuit SOA. To easily satisfy the previously mentioned relationship that the latch-up critical main current $I_L > I_{C(Sat)Max}$, also, the $I_{C(Sat)}$ may as well be small. However, it is impossible to make the $I_{C(Sat)}$ too small from an aspect of the conductive ability and in the ON state loss.

To enhance the latch-up breakdown voltage, that is, to make the latch-up critical main current $I_L$ large, emitter bypass structures shown in FIGS. 5 and 6 have been proposed. Sectional views taken along line 1B—1B of FIG. 5 and line 1B—1B of FIG. 6 are the same as in FIG. 1B. Since an N emitter region 5 is eliminated in a bypass region 13, the rate of a hole current flowing through a P base region 4 just below the N emitter region 5 is decreased. This supresses the occurrence of a latch-up. In the emitter bypass structure shown in FIG. 6, further, a channel width is somewhat reduced. This makes the $I_{C(Sat)}$ small more or less and results in the increase of the short-circuit SOA.

A conventional IGBT is structured as has been described, and it has been desired to enhance its latch-up current and short-circuit SOA. For that purpose, the emitter bypass structure has been proposed. However, the fact is that it does not bring a sufficient latch-up current and short-circuit SOA suitable for an actual application to an inverter device.

SUMMARY OF THE INVENTION

In the first aspect of the present invention, an insulated gate bipolar transistor comprises a first conductivity type first semiconductor layer having first and second major surfaces, a second conductivity type second semiconductor layer formed on the first major surface of the first semiconductor layer, a first conductivity type first semiconductor region selectively formed in a surface of the second semiconductor layer, a plurality of second conductivity type second semiconductor regions selectively formed in a surface of the first semiconductor region, a portion of the first semiconductor region, in a peripheral portion of the first semiconductor region, near a portion of the surface of the first semiconductor region between ends of surfaces of the first and second semiconductor regions being defined as a channel region, a distance D between the second semiconductor regions and a length L of the channel region which is defined as a distance between the ends of the surfaces of the first and second semiconductor regions satisfying $D > 2L$, an insulation film formed on the channel region, a control electrode formed on the insulation film, a first main electrode formed on the first and second semiconductor regions, and a second main electrode formed on the second major surface of the first semiconductor layer.

In the second aspect of the present invention, an insulated gate bipolar transistor comprises a first conductivity type first semiconductor layer having first and second major surfaces, a second conductivity type second semiconductor layer formed on the first major surface of the first semiconductor layer, a first conductivity type first semiconductor region selectively formed in a surface of the second semiconductor layer, a plurality of second conductivity type second semiconductor regions selectively formed in a surface of the first semiconductor region, a portion of the first semiconductor region, in a peripheral portion of the first semiconductor region, near a portion of the surface of the first semiconductor region between ends of surfaces of the first and second semiconductor regions being defined as a channel region, a first conductivity type high concentration region formed at least in a portion of the surface of the first semiconductor region between the second semiconductor regions, having an impurity concentration sufficiently higher than the first semiconductor region, being closer to an end portion of the first semiconductor region than the second semiconductor regions between the second semiconductor regions, an insulation film formed on the channel region, a control electrode formed on the insulation film, a first main electrode formed on the first and second semiconductor regions, and a second main electrode formed on the second major surface of the first semiconductor layer.

In the third aspect of the present invention, an insulated gate bipolar transistor having a breakdown voltage of about 500 to 750 volts comprises a first conductivity type first semiconductor layer having first and second major surfaces, a second conductivity type second semiconductor layer formed on the first major surface of the first semiconductor layer, a first conductivity type first semiconductor region selectively formed in a surface of the second semiconductor layer, a second conductivity type second semiconductor region selectively formed in a surface of the first semiconductor region, a portion of the first semiconductor region, in a peripheral portion of the first semiconductor region, near a portion of the surface of the first semiconductor region between ends of surfaces of the first and second semiconductor regions being defined as a channel region, a value $W_U$ per unit area of a width of the channel region, which is defined as a length along opposite ends of the surfaces of the first and second semiconductor regions, satisfying $140 \text{ cm}^{-1} \leq W_U \leq 280 \text{ cm}^{-1}$, an insulation film formed on the channel region, a control electrode formed on the insulation film, a first main electrode formed on the first and second semiconductor regions, and a second main electrode formed on the second major surface of the first semiconductor layer.

In the fourth aspect of the present invention, an insulated gate bipolar transistor having a breakdown voltage of about 1000 to 1500 volts comprises a first conductivity type first semiconductor layer ° having first and second major surfaces, a second conductivity type second semiconductor layer formed on the first major surface of the first semiconductor layer, a first conductivity type first semiconductor region selectively formed in a surface of the second semiconductor layer, a second conductivity type second semiconductor region selectively formed in a surface of the first semiconductor region, a portion of the first semiconductor region, in a peripheral portion of the first semiconductor region, near a portion of the surface of the first semiconductor region between ends of surfaces of the first and second semiconductor regions being defined as a channel region, a value $W_U$ per unit area of a width of the channel region, which is defined as a length along opposite ends of the surfaces of the first and second semiconductor regions satisfying $70 \text{ cm}^{-1} \leq W_U \leq 150 \text{ cm}^{-1}$, an insulation film formed on the channel region, a control electrode formed on the insulation film, a first main electrode formed on the first and second semiconductor regions, and a second main electrode formed on the second major surface of the first semiconductor layer.

According to the present invention, the interval D between plurality of second semiconductor regions is adapted to be larger than two times of the length L of a channel region so that a channel width can be effectively decreased and, therefore, a saturation current $I_{C(Sat)}$ can also be effectively decreased.

In the case where a first conductivity type high concentration region is provided which is closer to the end portion of a first semiconductor region than second semiconductor regions between these second semiconductor regions, a channel width can be effectively decreased even if the relationship of D>2L is not satisfied.

In the case where the channel width per unit area $W_U$ is adapted to be in a range of 140 cm$^{-1}$≦$W_U$≦280 cm$^{-1}$ in an IGBT of a breakdown voltage class of about 500 to 750 V or 70 cm$^{-1}$≦$W_U$≦150 cm$^{-1}$ in an IGBT of a breakdown voltage class of about 1000 to 1500 V, an IGBT having a short-circuit withstandability and a latch-up withstandability suitable for an inverter can be implemented.

Accordingly, it is an object of the present invention to provide an IGBT which can have a high short-circuit withstandability and a high latch-up withstandability (i.e., a high short-circuit SOA and a high latch-up current) sufficiently practically usable for an inverter device, and a method of fabricating the same.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4(A)—4(C) show waveforms in an IGBT short-circuiting test;

FIG. 5 and FIG. 6 are plan views showing conventional emitter bypass structures;

DESCRIPTION OF THE PREFERRED EMBODIMENT

Figure 7A:
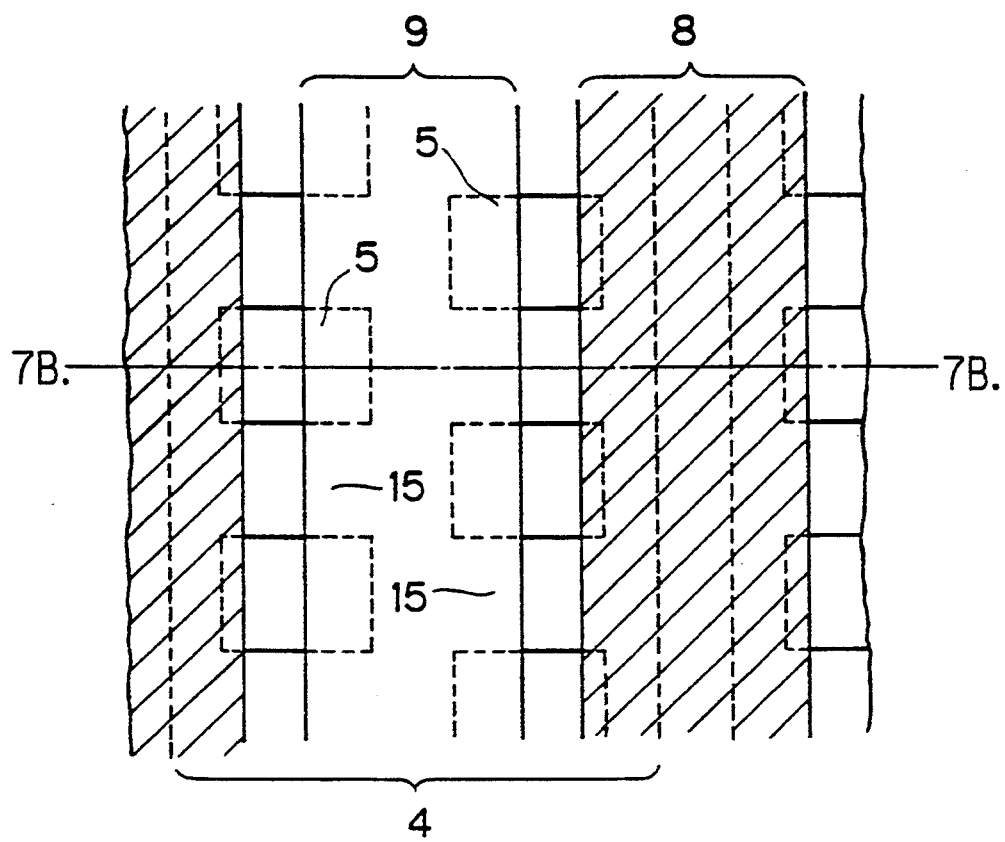
FIG. 7A is a plan view showing an embodiment of an IGBT according to the present invention.
Figure 7B:
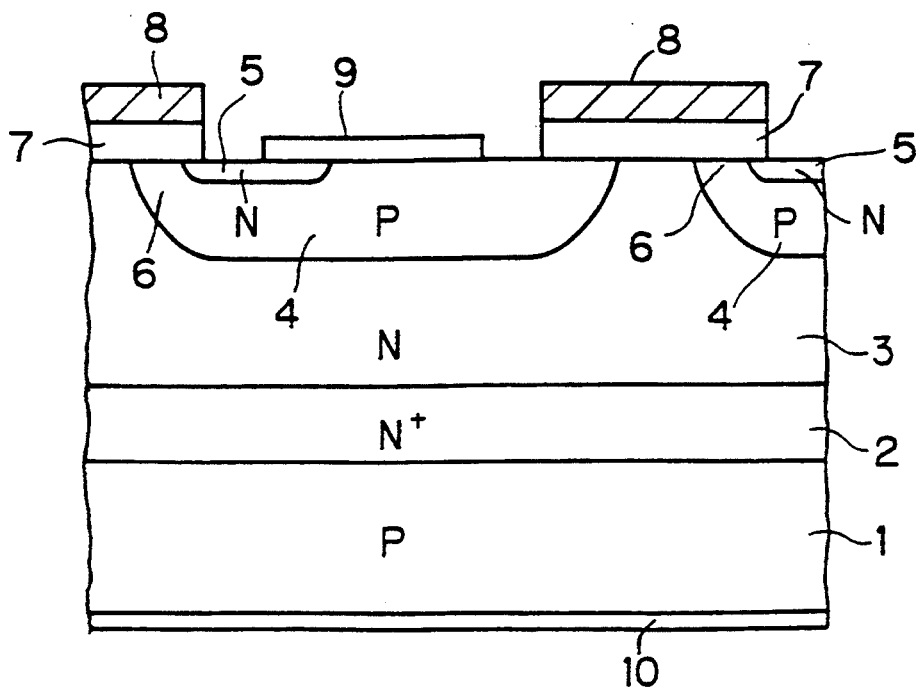
FIG. 7B is a cross-sectional view taken along line 7B—7B of FIG. 7A.

FIG. 7A is a plan view showing an embodiment of an IGBT according to the present invention, and FIG. 7B is a sectional view taken along line 7B—7B of FIG. 7A. The IGBT in this embodiment has a structure in which a number of IGBT cells having a stripe configuration are connected in parallel. As best shown in FIG. 7B, the IGBT cell includes a P collector layer 1, and an N+buffer layer 2 and an N epitaxial layer 3 provided on the P collector layer 1 in this sequence. P base regions 4 are selectively formed in the surface of the N epitaxial layer 3 and, further, N emitter regions 5 are selectively formed in the surface of each of the P base region 4. The N emitter regions 5 are of a plurality of islands which are formed by removing several parts of narrow strips of the original N emitter regions 5 at a regular interval. Areas from which those parts of the N emitter region 5 have been removed are defined as bypass regions 15.

Regions 6 in the vicinity of the surface of the P base region 4, between the surfaces of the N epitaxial layer 3 and N emitter regions 5, are defined as channel regions. Gate insulation films 7 are deposited on the channel regions 6. Each of the insulation films 7 also covers the N epitaxial layer 3 to be integrated in the adjacent IGBT cells. Gate electrodes 8 are formed of substance such as polysilicon on the gate insulation films 7. An emitter electrode 9 is formed of metal such as aluminum to be in electrically contact with both the P base layer 4 and the N emitter regions 5. In the IGBT device, all the gate electrodes 8 of the IGBT cells are electrically connected in common and all the emitter electrodes 9 of the IGBT cells are also electrically connected in common. A collector electrode 10 of metal is formed over the whole bottom surface of the P collector layer 1 to be integrated in all the IGBT cells.

Figure 8:
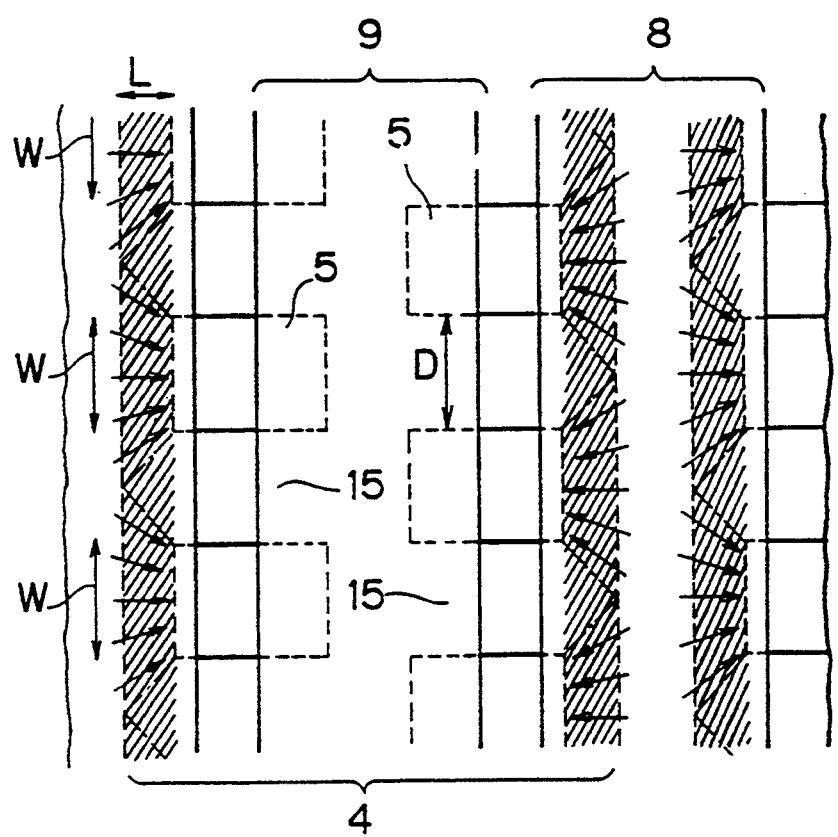
FIG. 8 is a plan view showing how an electric current flows in a channel region.

In the operation, when a positive voltage is applied to the gate electrodes 8 with a positive voltage being applied to a collector electrode 10 and a negative voltage being applied to the emitter electrode 9, inversion layers are formed in portions of the P base regions 4 just below the gate electrodes 8 as shadowed with oblique lines in FIG. 8, so that a main current flows from the collector electrode 10 to the emitter electrode 9. Since such inversion layers are formed not only in a part corresponding to each of the N emitter regions 5 (i.e., a channel region 6) but also in a part corresponding to each of the bypass regions 15, electrons injected from the N emitter regions 5 to the N epitaxial layer 3 through the inversion layer spread at an angle of approximately 45°. In other words, an electron current from the N epitaxial layer 3 flows into the N emitter regions 5 spreading at an angle of 45° as shown with arrows in FIG. 8. Therefore, when the width D of the bypass region 15 (i.e., an interval between the emitter regions 5) is narrow, the reduction of the width W of the channel region 6 is hardly effective even if the width W is reduced on a pattern. In such a case, the saturation current $I_{C(Sat)}$ is hardly decreased and, therefore, the increase of the short-circuit SOA can not be expected.

Thus, the width D must be sufficiently large to satisfactorily reduce the effective channel width. Allowing for the spreading of the electron current at an angle of 45°, the following relationship must be satisfied to reduce the effective channel width:

$$D > 2L$$

where L is a channel length.

Figure 9A:
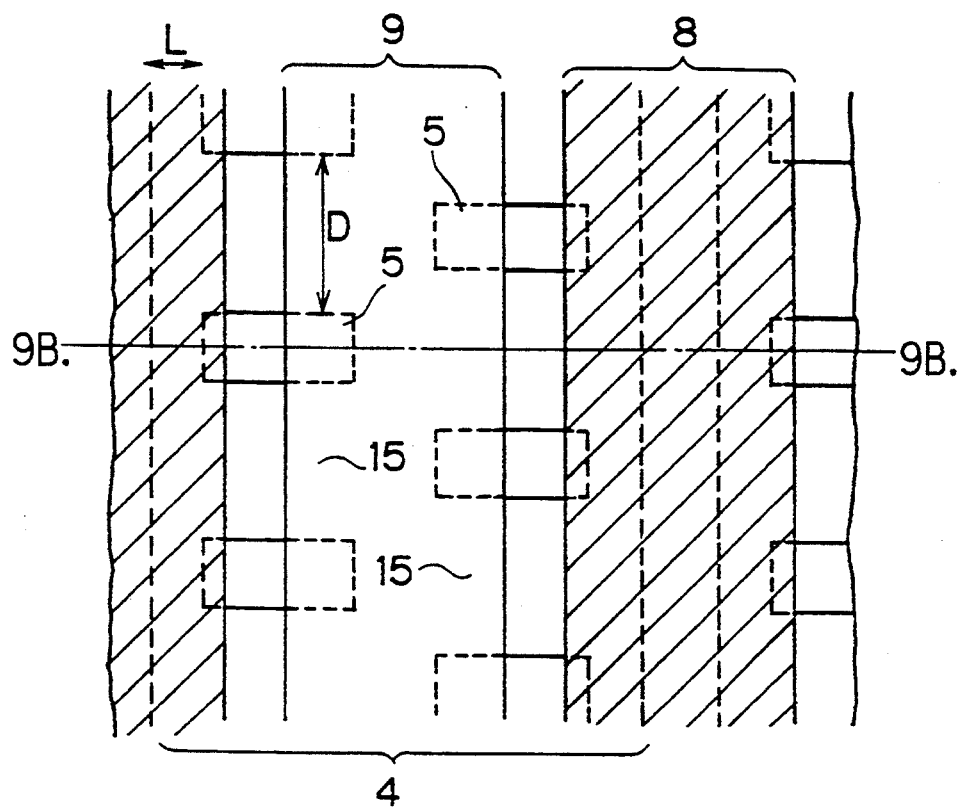
FIG. 9A and FIG. 10A are planning views showing other embodiemnts of the IGBT according to the present invention.
Figure 9B:
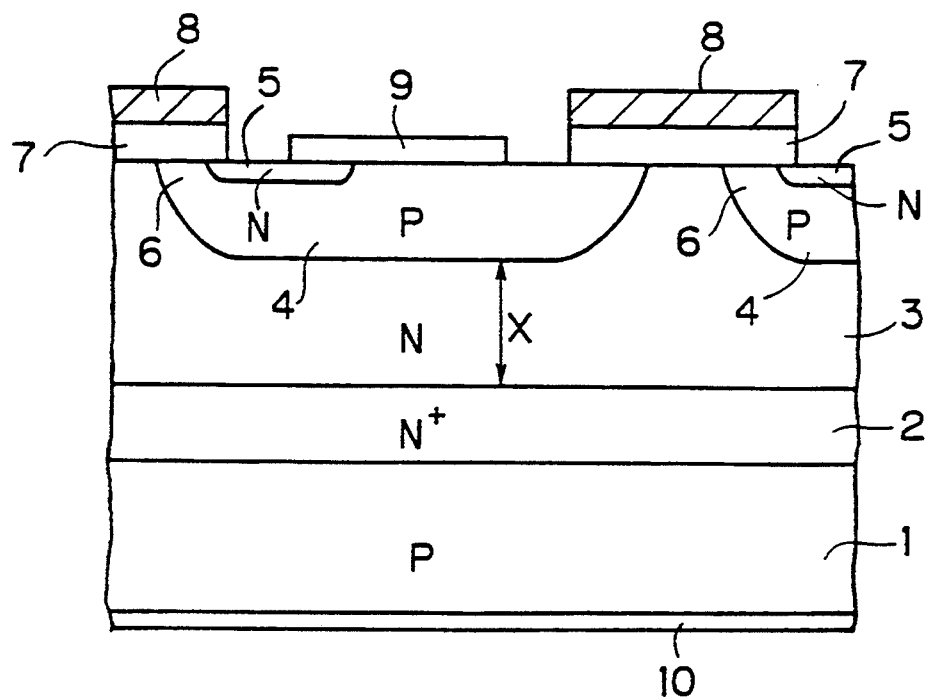
FIG. 9B and FIG. 10B are cross-sectional views taken along lines 9B—9B and 10B—10B of FIG. 9A and FIG. 10A, respectively.

FIG. 9A is a plan view showing another embodiment of the IGBT according to the present invention, taking the above stated requirement into consideration. FIG. 9B is a sectional view taken along line 9B—9B of FIG 9A. In this embodiment, $D > 2L$ is fully satisfied by setting the width D of the bypass region 15 to be larger than in the previous embodiment. This reduces the effective channel width and results in the saturation current $I_{C(Sat)}$ effectively decreasing, so that the increase of the short-circuit SOA can be attained. Indeed, $D < 2X$ must be satisfied because there exists a region where no electron current flows when $D > 2X$ and this leads to the considerable rise of an ON state voltage, where X is a thickness of the N epitaxial layer 3 just below the P base region 4. Hence, it is desirable that many bypass regions 15 whose width D is as small as possible are provided within a range of $D > 2L$.

Figure 10A:
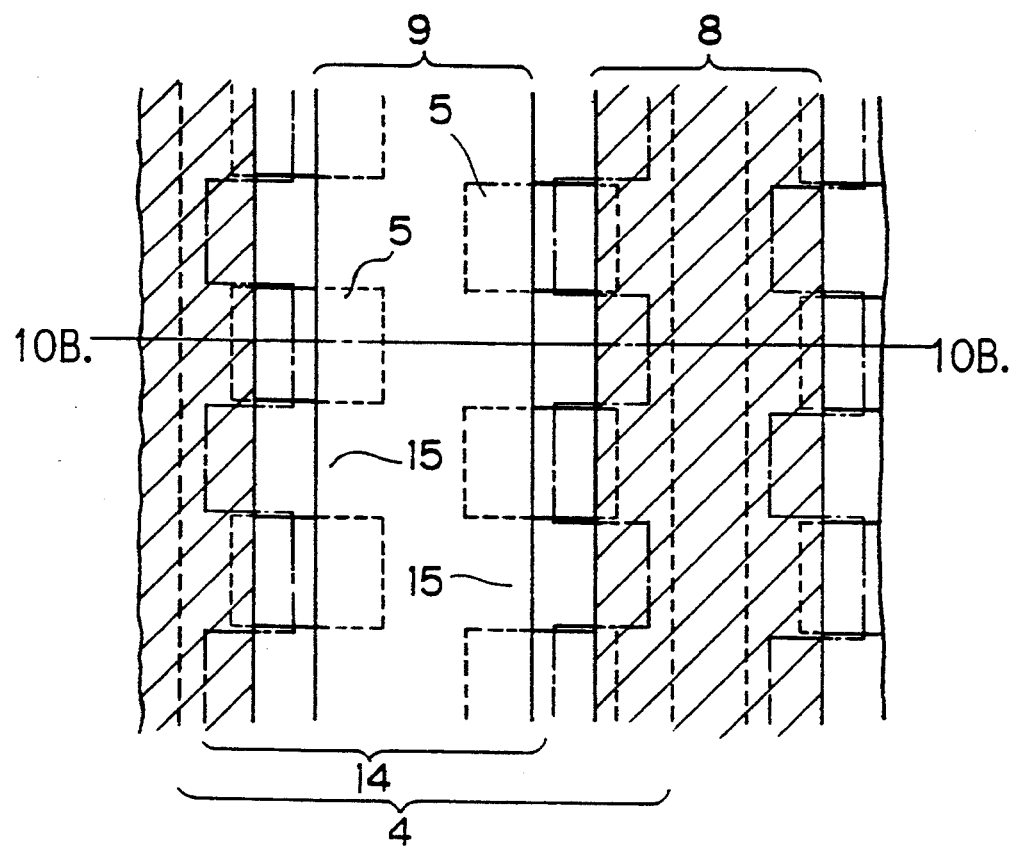
Figure 10B:
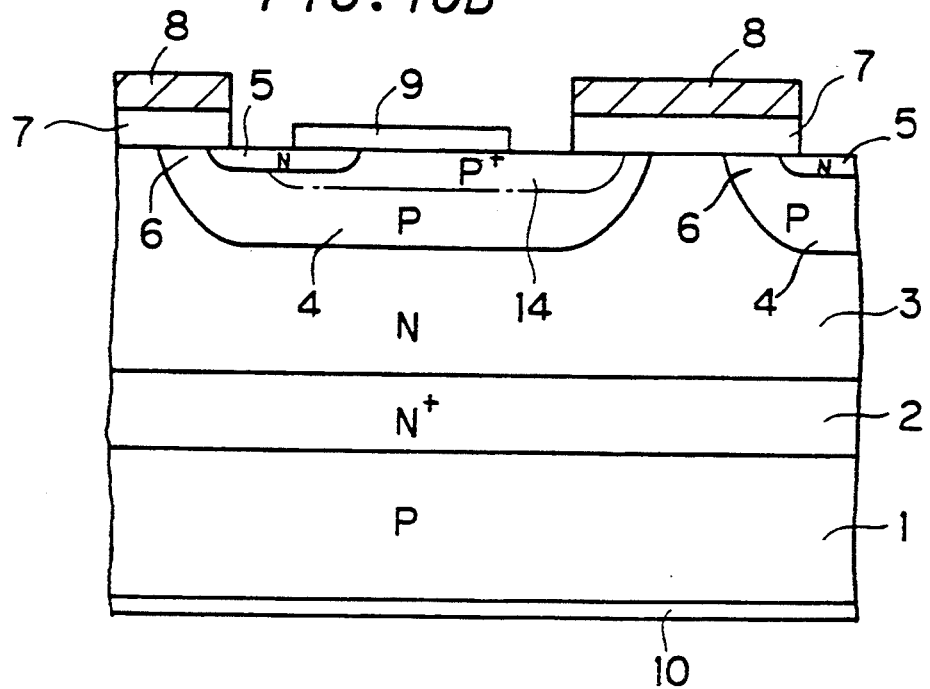
Figure 11:
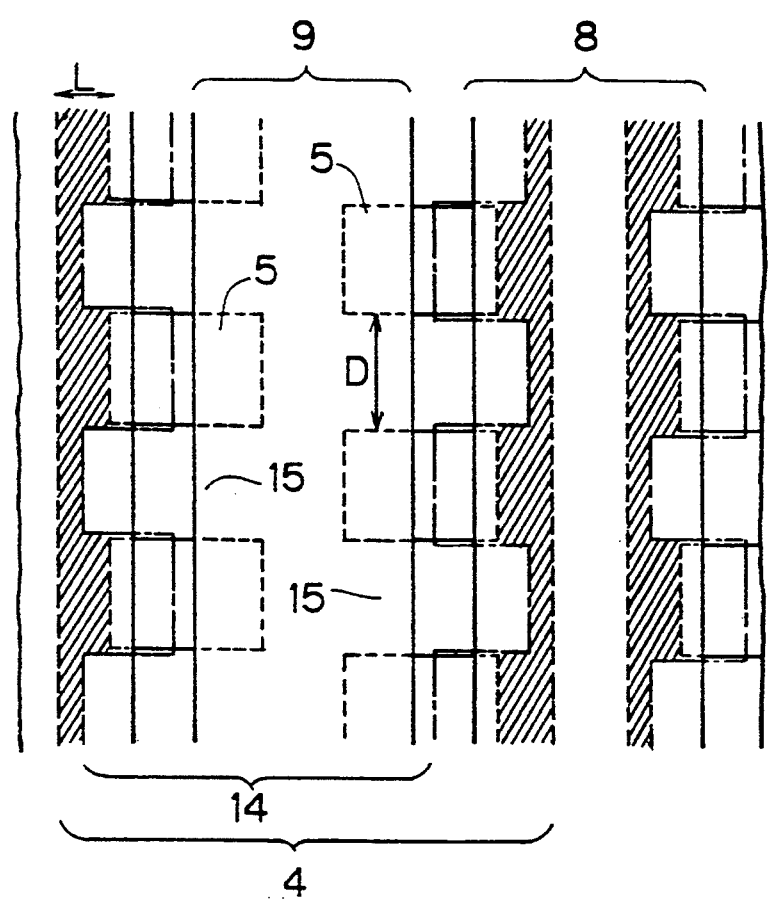
FIG. 11 is a plan view showing the manner of formation of a depletion layer.

FIG. 10A is a plan view showing a still another embodiment according to the IGBT of the present invention, and FIG. 10B is a sectional view taken along line 10B—10B of FIG. 10A. In this embodiment, the IGBT has a P+base region 14 provided in the middle of a P base region 4. The impurity concentration of the P+base region 14 is 5 times or more as large as that of the P base region 4. The end portion of the P+base region 14, as will be recognized from dash-dot lines in FIG. 10A, is near the end portion of the P base region 4 at portions corresponding to bypass regions 15 and is away from that at portions corresponding to N emitter regions 5, and thus makes an uneven edge configuration. In this IGBT, although inversion layers are formed in the P base region 4 just below gate electrodes 8 when a positive voltage is applied to the gate electrodes 8, no inversion layer is formed in the P+base region 14. This makes the configuration of the inversion layers uneven as shadowed with oblique lines in FIG. 11. Since the spreading of an electron current is suppressed in concave portions of the inversion layers, the effective channel width can be reduced even if the width D of the bypass regions 15 narrows to a range of $D < 2L$. Especially in an IGBT cell of polygon configuration such as a square configuration, the above stated structure is effective because the width D can not be sufficiently larger when the IGBT cell becomes small.

The reduction of a channel width will be discussed from a quantitative point of view. When an IGBT is used in a DC 220 V line, a product of a class of a breakdown voltage of 500 to 750 V is usually used. The IGBT of such a class has a rated current density of approximately 100 A/cm² in the ordinary operation. On the other hand, when an IGBT is used in a DC 440 V line, a product of a class of a breakdown voltage of 1000 to 1500 V is usually used. The IGBT of such a class has a rated current density of approximately 50 A/cm² in the ordinary operation. An IGBT (Sample 1) with a rated breakdown voltage of 500 V and a rated current density of 100 A/cm² as a representative of the product of 500 to 750 V breakdown voltage class, and an IGBT (Sample 2) with a rated breakdown voltage of 1000 V and a rated current density of 50 A/cm² as a representative of the product of 1000 to 1500 V breakdown voltage class will be discussed below.

Generally, a saturation current density $j_{C(Sat)}$ of an IGBT is in proportion to its channel width pep unit area $W_U$.

$$j_{C(Sat)} \propto W_U$$

Figure 12:
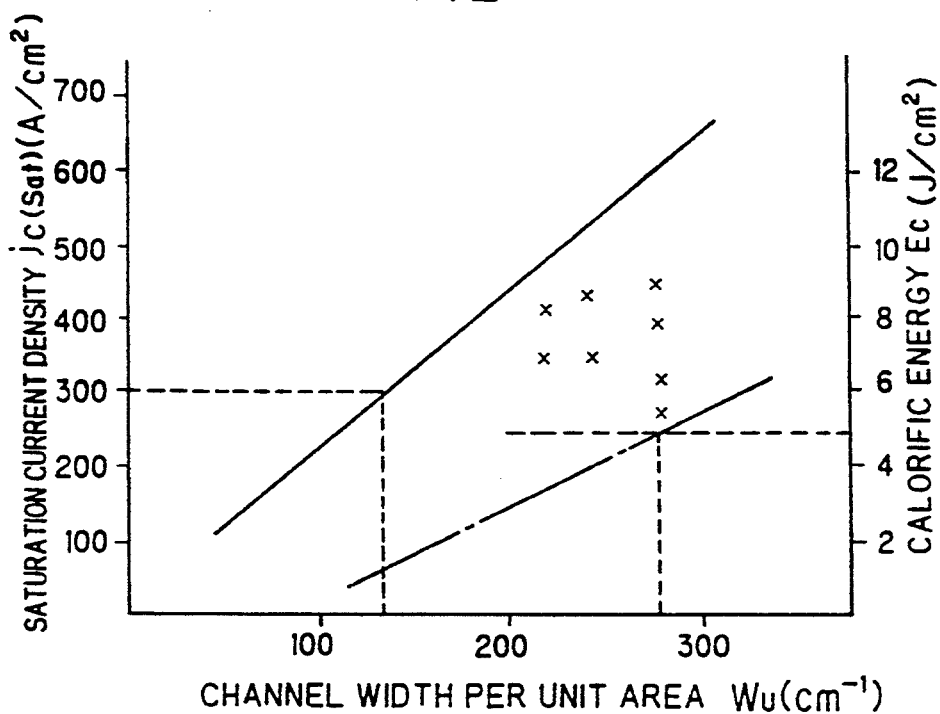
FIG. 12 and FIG. 13 show graphs concerning a relationship between a channel width per unit area and a saturation current density as well as a calorific energy.
Figure 13:
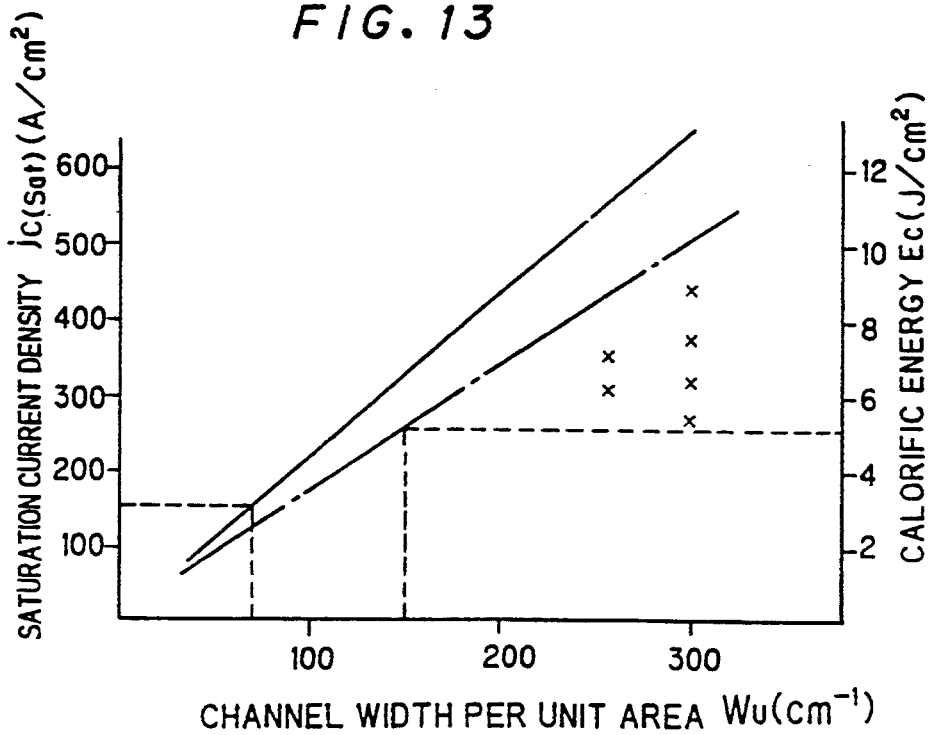

A solid line of a graph in FIG. 12 shows the relationship between the saturation current density $j_{C(Sat)}$ (A/cm²) and the channel width per unit area $W_U$ (cm⁻¹) of the IGBT of Sample 1, and a solid line of a graph in FIG. 13 shows the relationship between the saturation current density $j_{C(Sat)}$ (A/cm²) and the channel width per unit area $W_U$ (cm⁻¹) of the IGBT of Sample 2. The IGBT of Sample 1 requires a peak current over three times of the rated current density of 100 A/cm², that it, the saturation current density $j_{C(Sat)}$ must be 300 A/cm² or more. According to the solid line graph of FIG. 12, it is necessary that the channel width per unit area $W_U$ satisfies $W_U \geq 140$ cm. On the other hand, the IGBT of Sample 2 requires a peak current over three times of the rated current density of 50 A/cm², that it, the saturation current density $j_{C(Sat)}$ must be 150 A/cm² or more. According to the solid line graph of FIG. 13, it is necessary that the channel width per unit area $W_U$ satisfies $W_U \geq 70$ cm⁻¹.

When a calorific energy applied to the IGBT in short-circuiting goes beyond a certain value, the IGBT is thermally broken down. The calorific energy $E_C$ in short-circuiting is given by the following equation:

$$E_C = j_{C(Sat)} \times V_C \times t_W$$

where $V_C$ is a voltage applied across the collector and the emitter of the IGBT in short-circuiting and $t_W$ is a period of time of the short-circuit. The IGBT of Sample 1 desirably requires a short-circuit breakdown voltage of 400 V at a minimum compared with the rated breakdown voltage of 500 V in the ordinary operation. The IGBT must endure without thermally breaking down for 10µ sec at the shortest in the condition that the minimum voltage of 400 V is directly applied without load in its ON state. This is because a protection circuit can function effectively after that period. On the other hand, the IGBT of Sample 2 desirably requires a short-circuit breakdown voltage of 800 V at a minimum compared with the rated breakdown voltage of 500 V in the ordinary operation. Similar to the IGBT of Sample 1, the IGBT of Sample 2 must also endure without thermally breaking down for 10µ sec at the shortest against the minimum voltage of 800 V applied in a short circuiting manner.

A dash-dot line of the graph in FIG. 12 shows the relationship between the channel width per unit area $W_U$ (cm⁻¹) and the calorific energy $E_C$ (Joule/cm²) when a voltage of 400 V is applied to the IGBT of Sample 1 for 10 µsec in a short-circuiting manner. A dash-dot line of the graph in FIG. 13 shows the relationship between the channel width per unit area $W_U$ (cm⁻¹) and the calorific energy $E_C$(Joule/cm²) when a voltage of 800 V is applied to the IGBT of Sample 2 for 10μ sec in a short-circuiting manner. Marks x in FIGS. 12 and 13 denote breakdown values given by an experiment. According to FIGS. 12 and 13, it can be recognized that the IGBTs of Samples 1 and 2 are thermally broken down when the calorific energy $E_C$ reaches approximately 5 Joule/cm$^2$. As will be recognized from the dash-dot line graphs in FIGS. 12 and 13, the channel width per unit area $W_U$ of the IGBT of Sample 1 must satisfy $W_U \leq 280$ cm$^{-1}$, and the channel width per unit area $W_U$ of the IGBT of Sample 2 must satisfy $W_U \leq 150$ cm$^{-1}$ in order that both the IGBTs of Sample 1 and Sample 2 may endure a thermal breakdown.

Accordingly, the IGBT suitable for an inverter is desirably designed with the following channel width per unit area $W_U$.

The IGBT of a breakdown voltage class of 500–750 V $$140 \text{ cm}^{-1} \leq W_U \leq 280 \text{ cm}^{-1}$$

The IGBT of a breakdown voltage class of 1000–1500 V $$70 \text{ cm}^{-1} \leq W_U \leq 150 \text{ cm}^{-1}$$

Figure 14A:
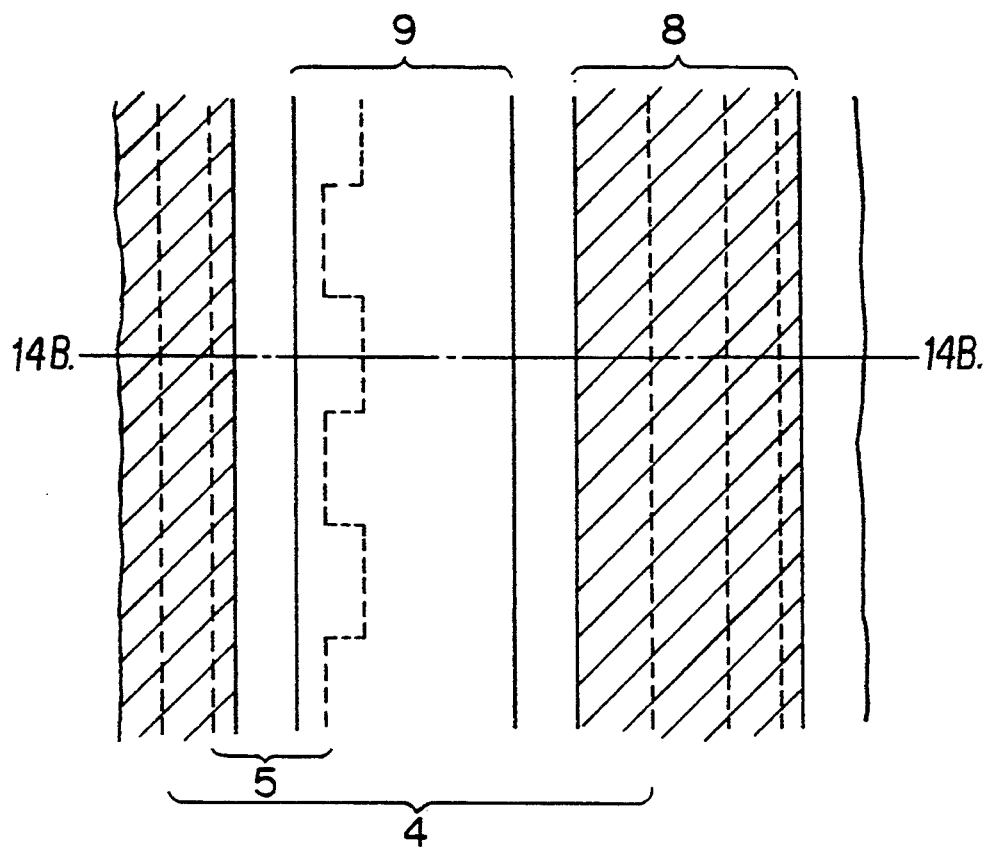
FIG. 14A is a plan view showing still another embodiment of the IGBT according to the present invention.
Figure 14B:
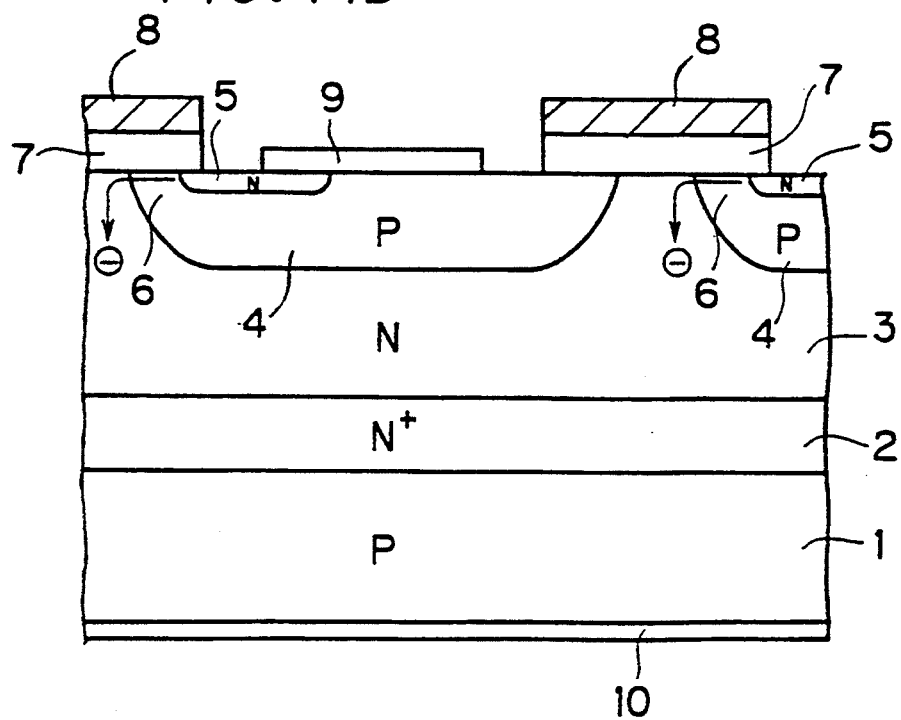
FIG. 14B is a cross-sectional view taken along line 14B—14B of FIG. 14A.
Figure 15:
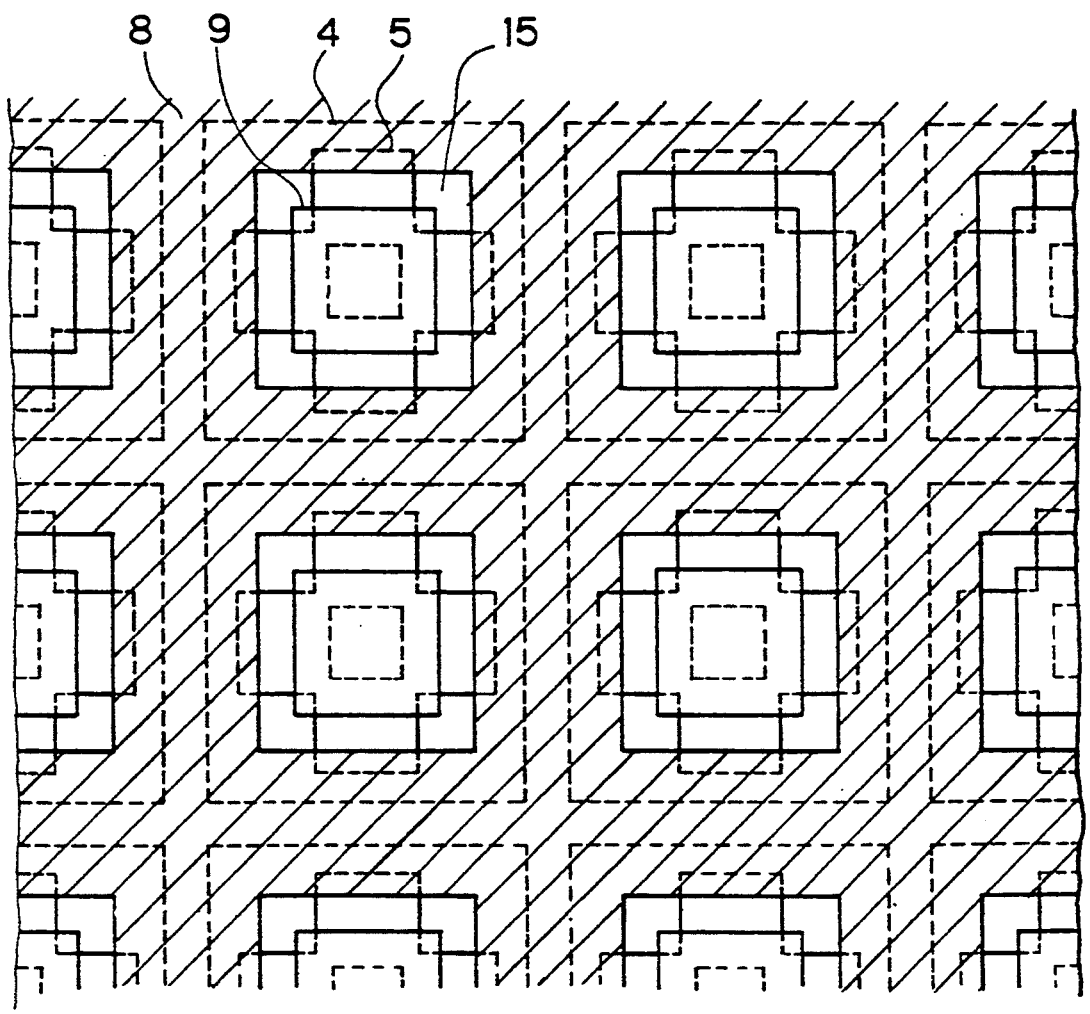
FIG. 15 to FIG. 18 are plan views showing still other embodiments of the IGBT according to the present invention.
Figure 16:
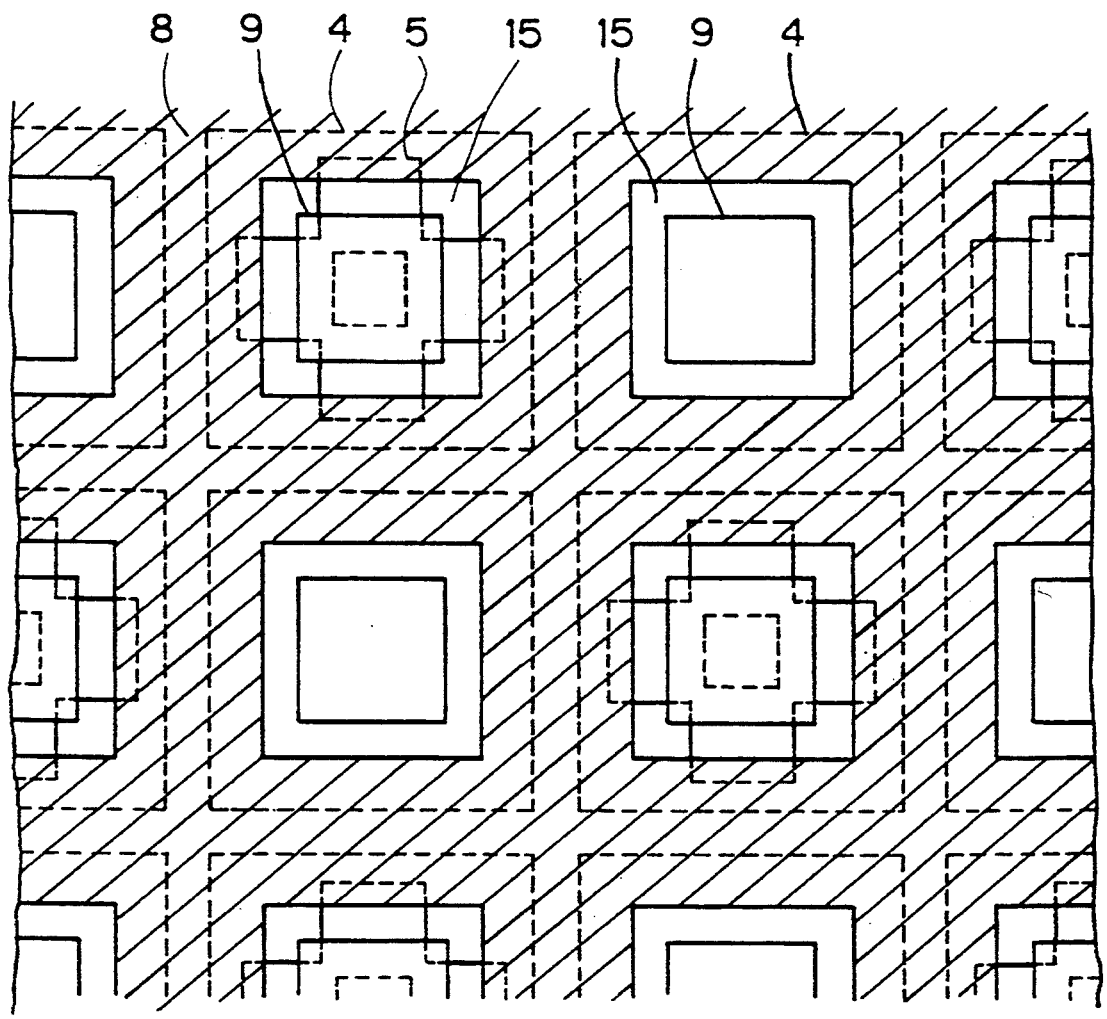

An IGBT structure for effectively adjusting the channel width per unit area $W_U$ will be described. FIG. 14A is a plan view showing yet another embodiment of the IGBT according to the present invention, and FIG. 14B is a sectional view taken along line 14B—14B of FIG. 14A. In this embodiment, one of two N emitter regions 5 in an IGBT cell having a stripe configuration is deleted, that is, only one strip of N emitter region 5 is provided on one side of-the cell. In this way, the channel width per unit area $W_U$ can be a half compared with the channel width in the case of two strips of N emitter regions 5 on both sides. It is desirable that each N emitter region 5 is provided on the same side of each IGBT cell in order that the distribution of electron current flowing through a channel region 6 may be uniform throughout the whole IGBT chip.

Figure 17:
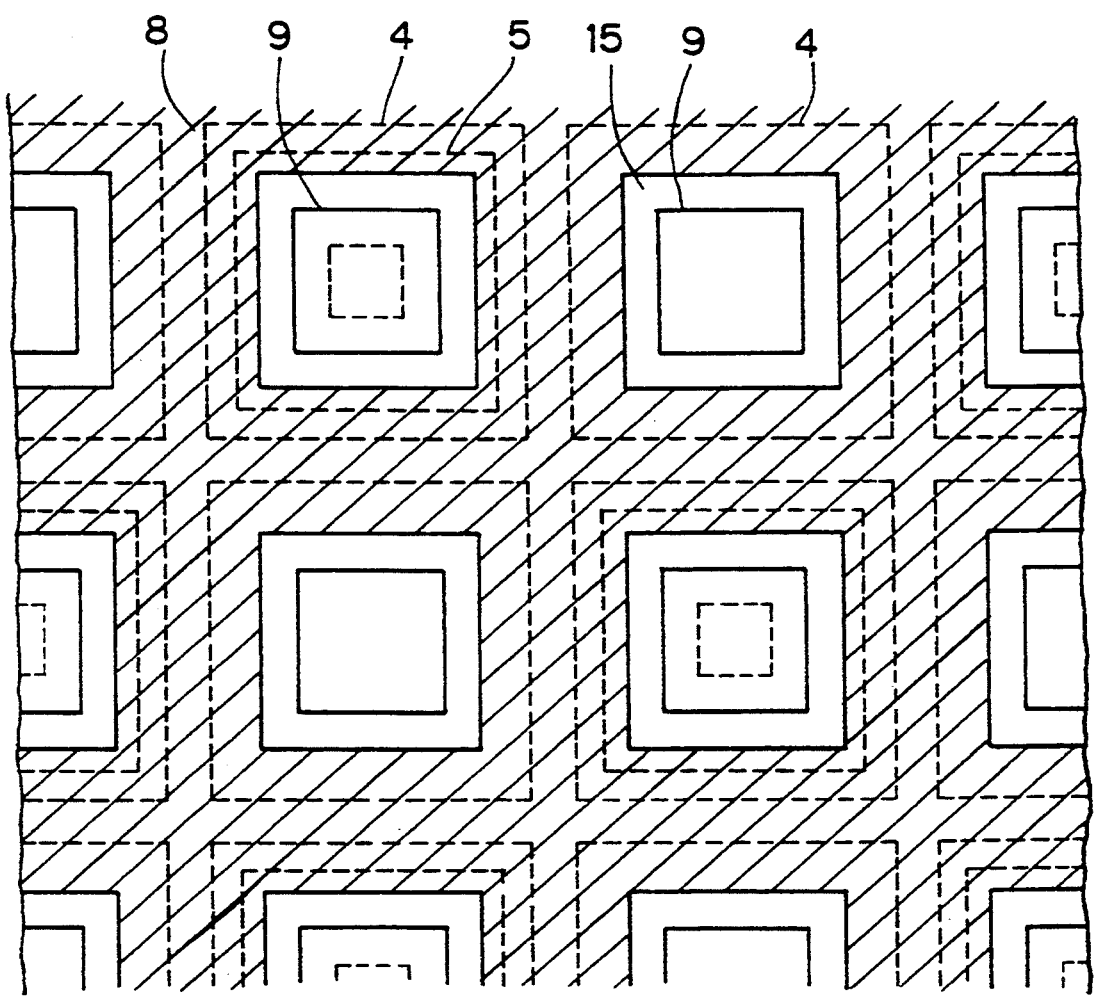
Figure 18:
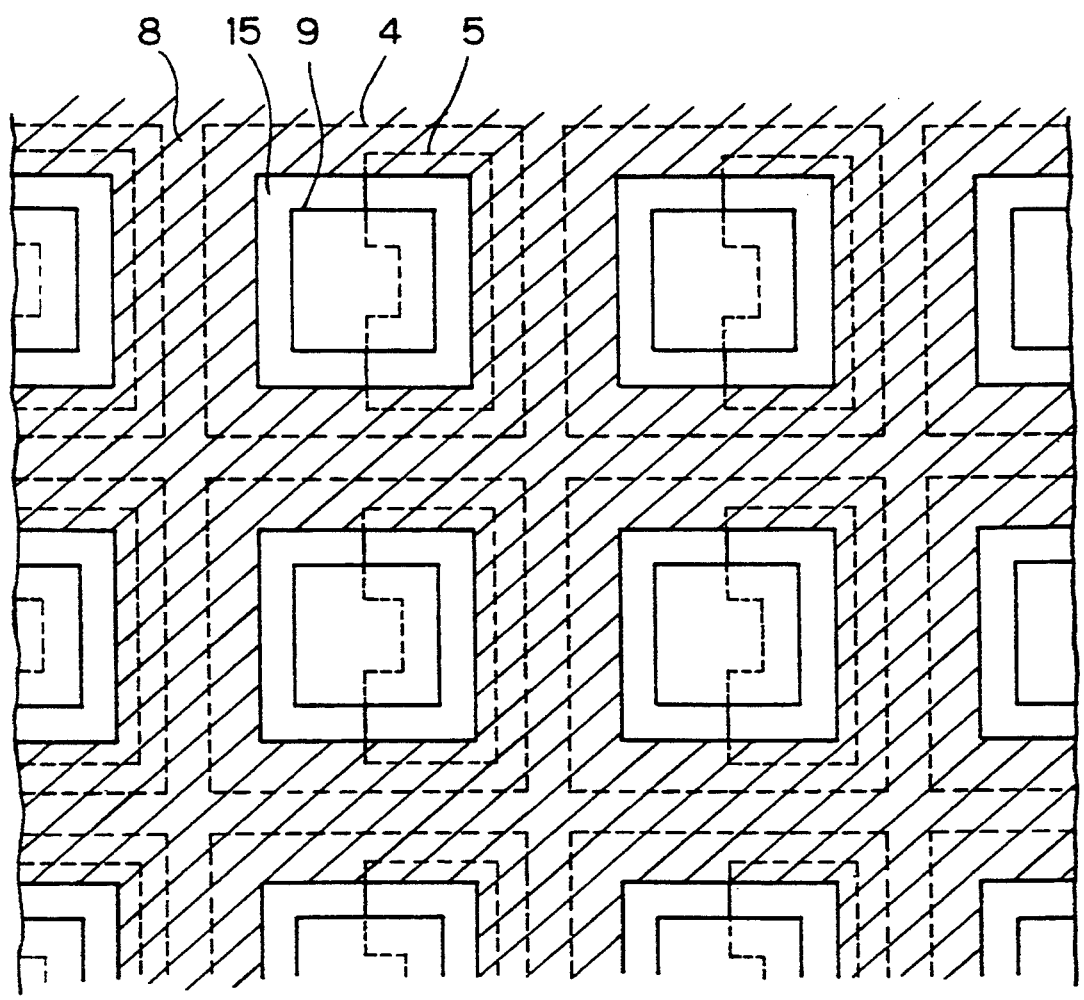

FIGS. 15 to 18 are plan views showing further embodiments of the IGBT according to the present invention. In these embodiment, IGBTs include a plurality of square IGBT cells arranged in matrix. In the IGBT in FIG. 15, each IGBT cell has a emitter bypass region 15 provided at a predetermined rate. The IGBTs in FIGS. 16 and 17 include IGBT cells with a emitter region 5 and IGBT cells without the same (i.e., IGBT cells in which the rate of the emitter bypass region 15 is 100%). In the IGBT in FIG. 16, the IGBT cells having the emitter region 5 are further provided with the emitter bypass region 15 with a predetermined rate. In the IGBT of FIG. 17, the IGBT cells having the emitter region 5 include no emitter bypass region 15. In the IGBT in FIG. 18, each IGBT cell is provided with the emitter region 5 in its half section and provided with the emitter bypass region 15 in the remaining half. In these embodiments, the rate of the emitter bypass region 15 can be appropriately varied. These embodiments may also be combined in appropriate ways. It is desirable that emitter bypass regions 15 are distributed as uniformly as possible throughout the whole IGBT chip in order that the distribution of an electron current may become uniform throughout the whole IGBT chip. The P+base region 14 shown in the cross sectional view in FIG. 10B can be incorporated into the IGBT cells of the above embodiments so that the reduction of the channel width by the emitter bypass region 15 can be more effective.

Figure 19:
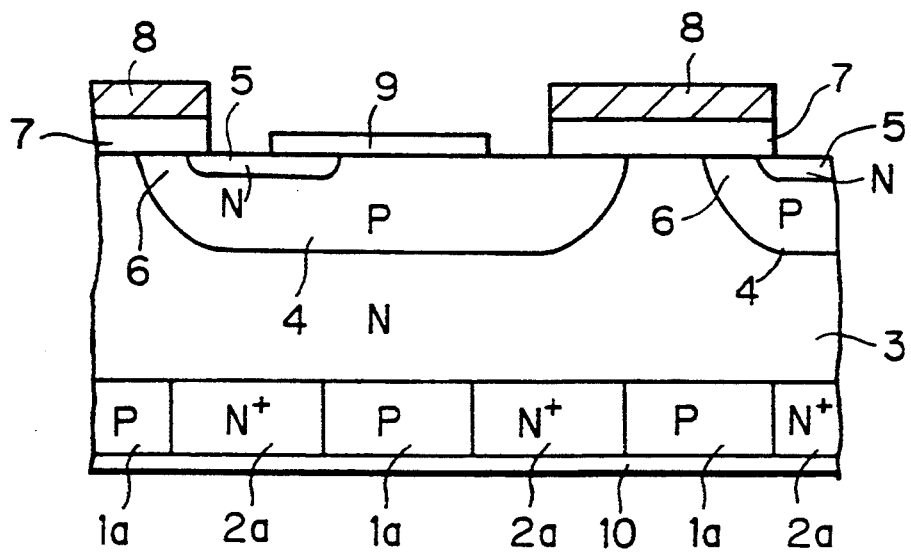
FIG. 19 is a cross-section view showing a collector shorted structure.

FIG. 19 is a sectional view showing a collector shorted structure. In this structure, a P collector layer 1a and an N+buffer layer 2a are alternately formed on the bottom surface of an N epitaxial layer 3, and a collector electrode 10 is formed thereover. Since carriers in the N epitaxial layer 3 are rapidly drawn out to the collector electrode 10 through the N+buffer layer 2a, switching speed is increased. Such a collector short structure may be applied to the IGBT according to the present invention.

Figure 20A:
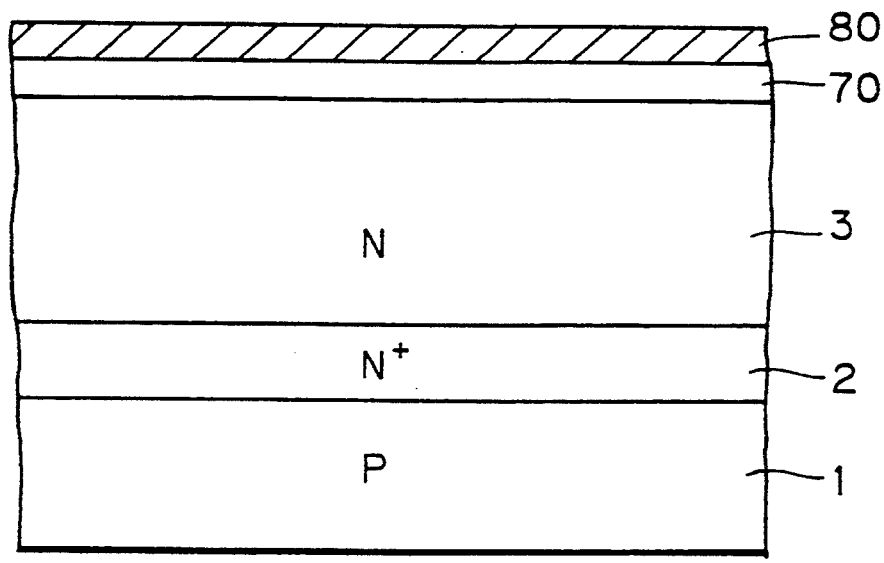
FIG. 20A to FIG. 20D are cross-sectional views showing an example of a fabricating method of the IGBT according to the present invention.

FIGS. 20A to 20D are sectional views showing an exemplary method of manufacturing the IGBT (breakdown voltage class of 500–700 V) according to the present invention. As shown in FIG. 20A, the first process stage includes the steps of forming an N+buffer layer 2 having a specific resistance of approximately 0.1 Ω.cm by about 20 μm in thickness on a P collector layer 1 of P semiconductor substrate having a specific resistance of approximately 0.005–0.02 Ω.cm by means of epitaxial growing, further forming an N epitaxial layer 3 having a high specific resistance of approximately 30 Ω.cm by about 60 μm in thickness on the N+buffer layer 2 by means of epitaxial growing, depositing an oxide film 70 over the whole surface of the epitaxial layer 3, and depositing a polysilicon layer 80 on the whole surface of the oxide film 70 by means of CVD or the like.

Figure 20B:
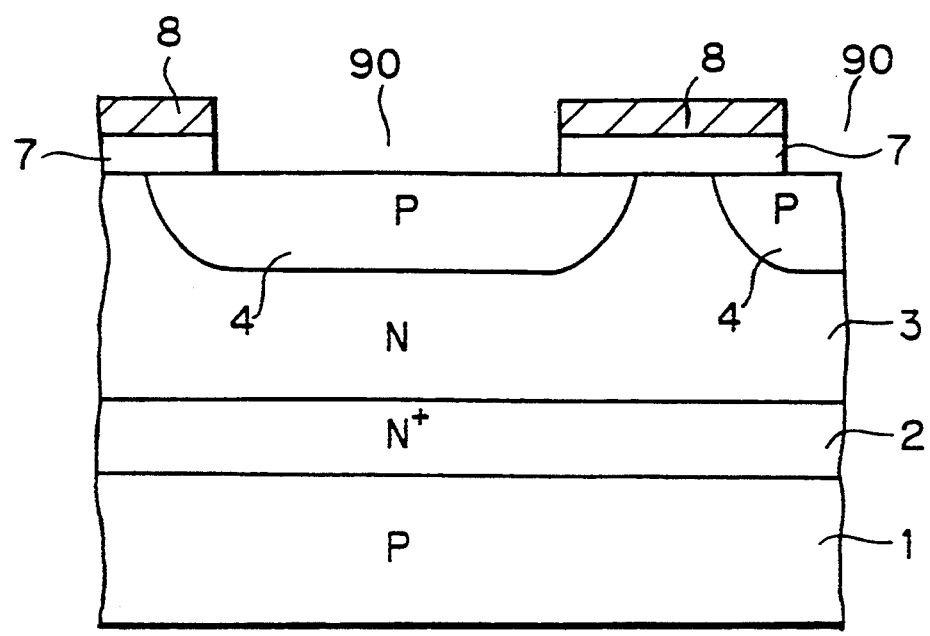

Then, as shown in FIG. 20B, the oxide film 70 and the polysilicon layer 80 are selectively etched to open windows 90. This step develops gate oxide films 7 and gate electrodes 8 from the oxide film 70 and the polysilicon layer 80, respectively. The configuration of windows 90 corresponds to that of IGBT cells, such as a stripe configuration and a polygonal configuration like a square. P type impurities are selectively added to the N epitaxial layer 3 through the windows 90 by means of ion implantation method, diffusion method and the like to form P base regions 4 of a configuration corresponding to the IGBT cell configuration.

Figure 1A:
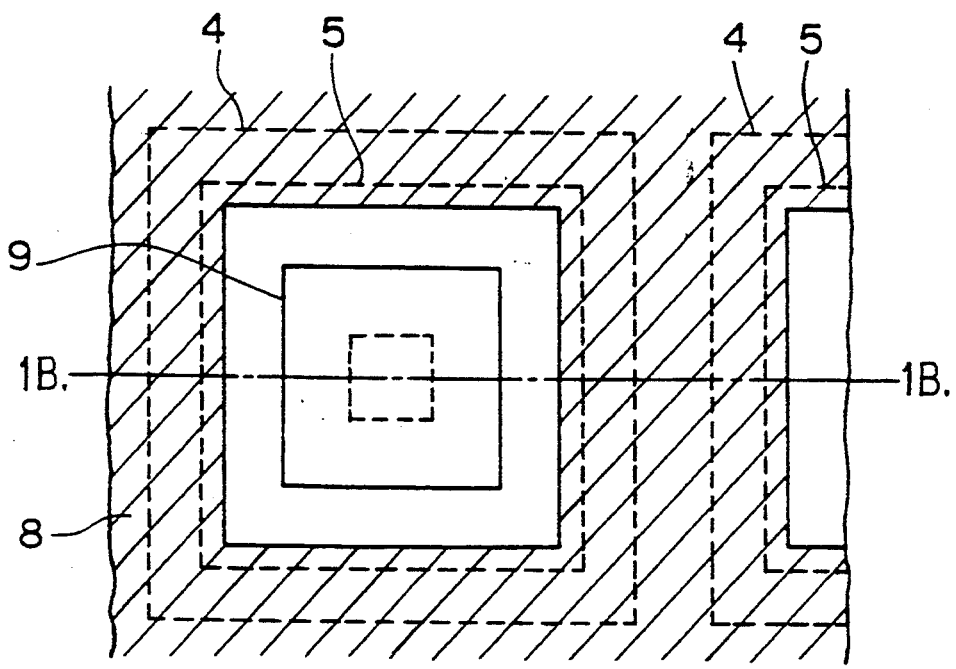
FIG. 1A is a plan view showing a conventional IGBT.
Figure 1B:
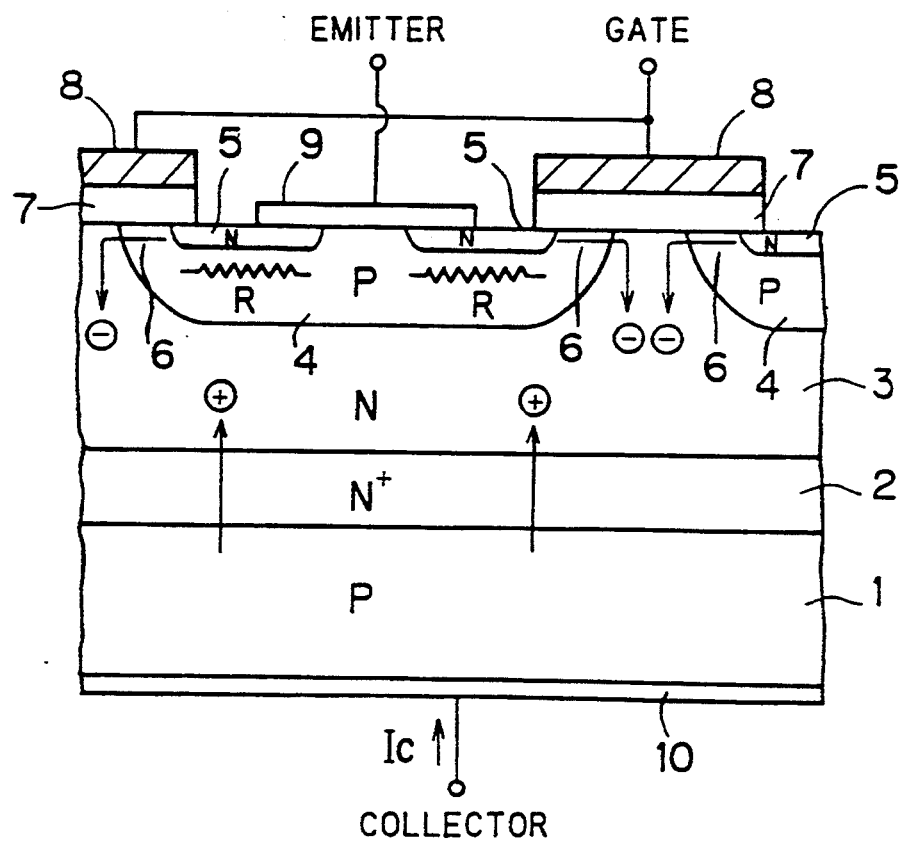
FIG. 1B is a cross-sectional view taken along line 1B—1B of FIG. 1A.
Figure 2:
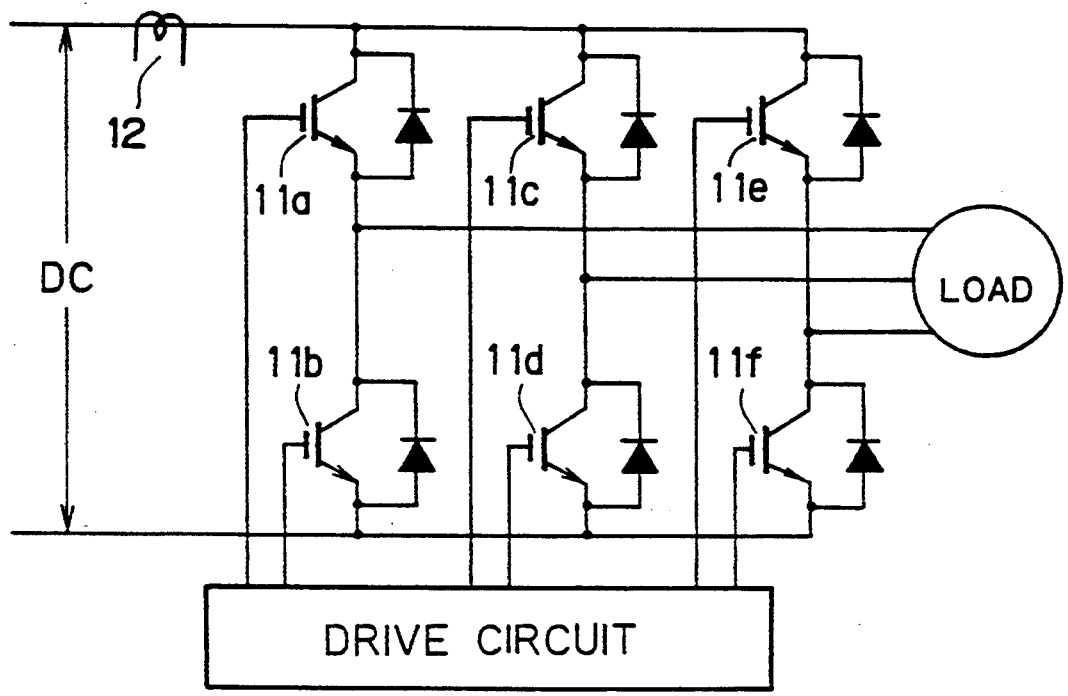
FIG. 2 is a circuit diagram showing an inverter device in which IGBTS are employed.
Figure 3:
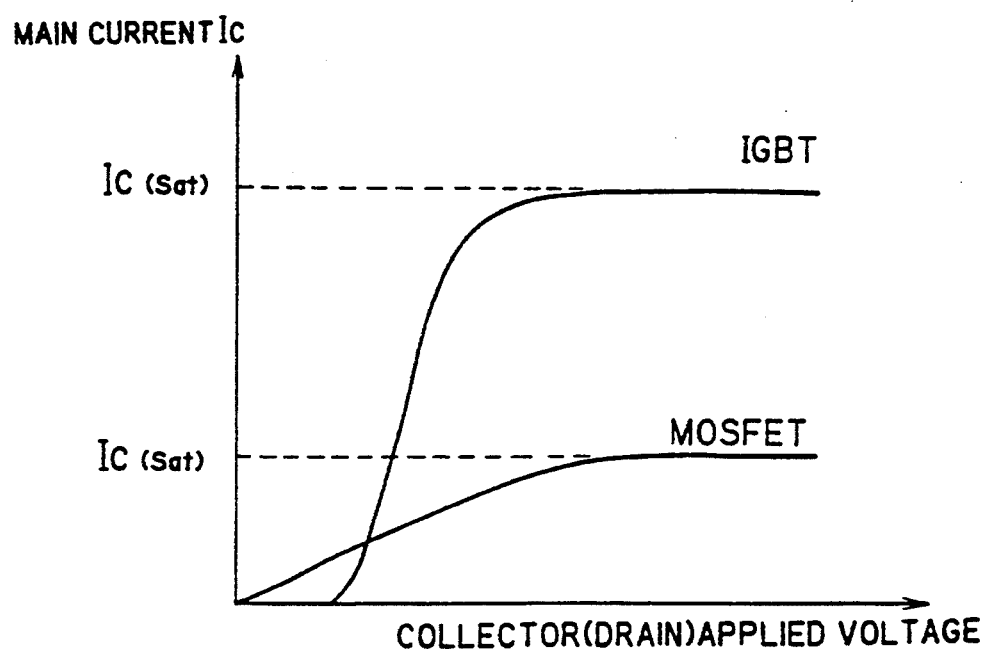
FIG. 3 shows graphs of a saturation current of an IGBT and a MOSFET.
Figure 6:
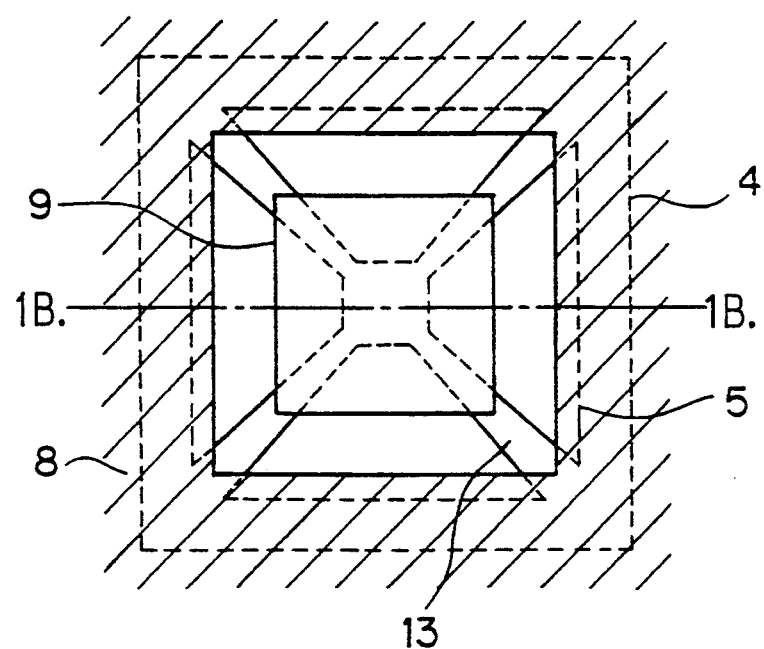
Figure 20C:
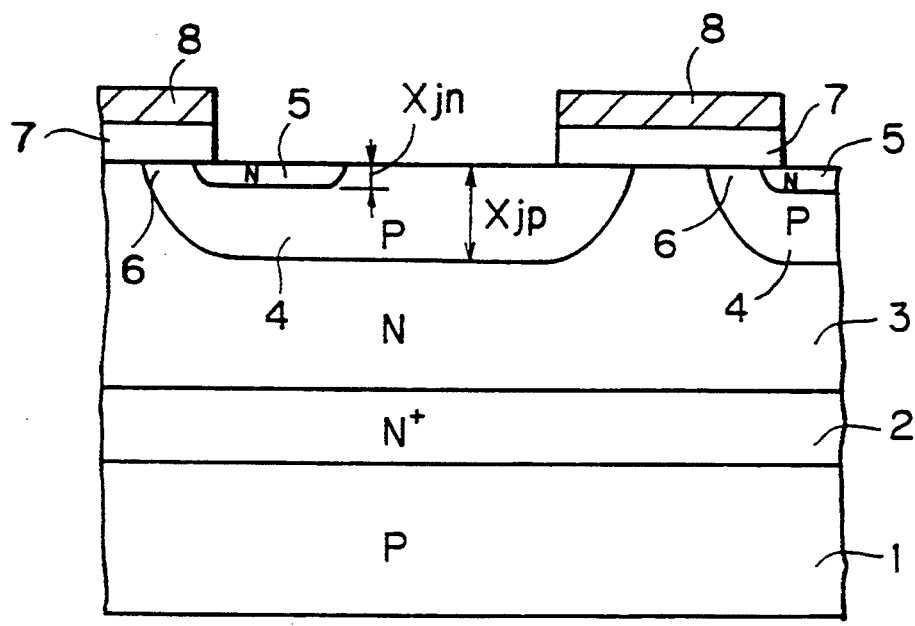

Then, a patterned mask not shown is formed and N type impurities are selectively added to the P base regions 4 by means of ion implantation method, diffusion method and the like to form N emitter regions 5 of a desired pattern in accordance with any of the above stated embodiments, as shown in FIG. 20C. In the pattern illustrated in FIG. 2, for example, the interval D between the N emitter regions 5 are set to satisfy the following relationship:

$$D > 2 \times 0.8(X_{jp} - X_{jn})$$

where $X_{jp}$ and $X_{jn}$ are depths of the P base regions 4 and the N emitter regions 5, respectively. The coefficient 0.8 indicates the rate of the lateral diffusion to the vertical diffusion. Thus, $0.8(X_{jp} - X_{jn})$ corresponds to the channel length L of FIG. 8.

Figure 20D:
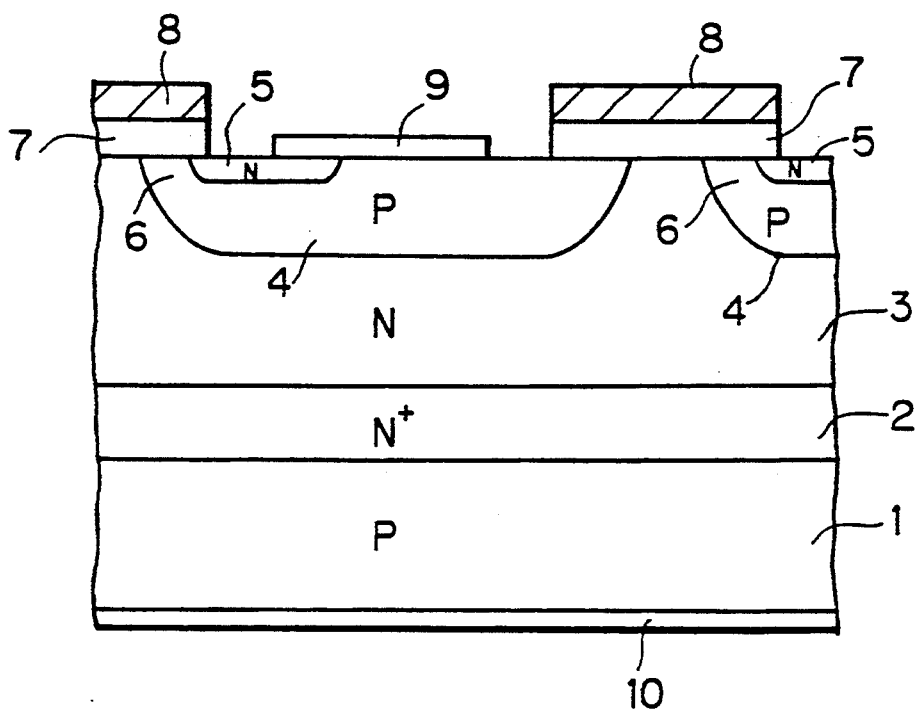

As shown in FIG. 20D, the last process stage to finish the IGBT device includes the steps of forming the emitter electrode 9 of metal such as aluminum to be in ohmic contact with both the N emitter region 5 and the P base region 4, and thereafter forming the collector electrode 10 of metal such as Ti—Ni—Au to be in ohmic contact with the bottom surface of the P collector layer 1.

In case of forming the P+base region 14 of FIG. 10B, a process step of selectively injecting into the P base regions 4 P type impurities of an amount sufficiently larger (desirably 5 times or more) than in forming the P base regions 4 may be performed between the steps of FIG. 20B and FIG. 20C.

Figure 21:
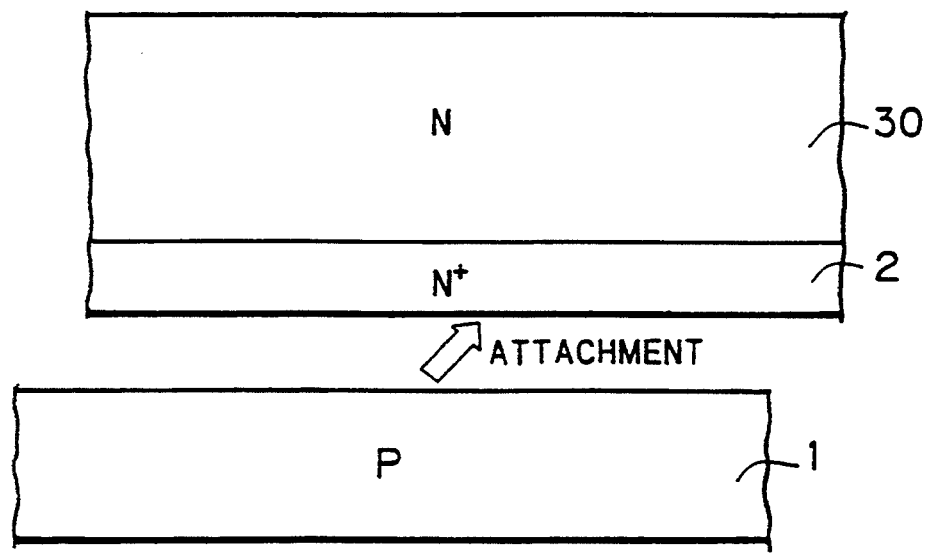
FIG. 21 is a view showing a modification in fabricating steps.

Instead of forming the N+buffer layer 2 and the N epitaxial layer 3 in sequence on the P semiconductor substrate 1 in the process step of FIG. 20A, the N+buffer layer 2 may be formed by diffusing N type impurities over the whole bottom surface of a high specific resistance N semiconductor substrate 30, and then the P collector layer 1 of a P semiconductor substrate may be attached to the substrate 30, as shown in FIG. 21. In this case, both the substrates can be easily adherent to each other by subjecting the contact surfaces of both the substrates to a hydrophilic treatment, bringing the substrates into contact and then putting a heat treatment into practice.

In case of manufacturing the IGBT of a breakdown voltage of class of 1000-1500 V, the specific resistance of the N epitaxial layer 3 may be changed to 60 $\Omega$.cm and the thickness of the N epitaxial layer 3 may be changed to 100 $\mu$m. The specific resistance of the P collector layer 1, the specific resistance of the N+buffer layer 2 and the thickness of the N+buffer layer 2 are the same as those in the above mentioned IGBT of breakdown voltage class of 500-750 V.

Although N channel IGBTs have been explained in the above embodiments, it should be noted that the present invention can also be applied to a P channel IGBT, as a matter of course.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. An insulated gate bipolar transistor, fabricated by a method comprising the steps of:

preparing a first conductivity type first semiconductor layer having first and second major surfaces;

forming a second conductivity type second semiconductor layer on said first major surface of said first semiconductor layer;

forming a first conductivity type first semiconductor region selectively in a surface of said second semiconductor layer;

forming a plurality of second conductivity type second semiconductor regions selectively in a surface of said first semiconductor region, a portion of said first semiconductor region, in a peripheral portion of said first semiconductor region, near a portion of the surface of said first semiconductor region between ends of surfaces of said first and second semiconductor regions being defined as a channel region, a distance D between two of said second semiconductor regions formed in a direction perpendicular to a channel length direction and the length L of said channel region which is defined as a distance between the ends of the surfaces of said first and second semiconductor regions satisfying D>2L;

forming an insulation film on said channel region;

forming a control electrode on said insulation film;

forming a first main electrode on said first and second semiconductor regions; and forming a second main electrode on said second major surface of said first semiconductor layer;

wherein a value $E_c$ per unit area of a calorific energy of said insulated gate bipolar transistor satisfies $E_c < 5$ Joules/cm$^2$.

2. An insulted gate bipolar transistor in accordance with claim 1, said method further comprising the step of;

forming a first conductivity type high concentration region at least in a portion of the surface of said first semiconductor region between said second semiconductor regions, having an impurity concentration sufficiently higher than said first semiconductor region, being closer to an end portion of said first semiconductor region than said second semiconductor regions between said second semiconductor regions.

3. An insulated gate bipolar transistor having a breakdown voltage of about 500 to 750 volts, fabricated by a method comprising the steps of:

preparing a first conductivity type first semiconductor layer having first and second major surfaces;

forming a second conductivity type second semiconductor layer on said first major surface of said first semiconductor layer;

forming a first conductivity type first semiconductor region selectively in a surface of said second semiconductor layer;

forming a second conductivity type second semiconductor region selectively in a surface of said first semiconductor region, a portion of said first semiconductor region, in a peripheral portion of said first semiconductor region, near a portion of the surface of said first semiconductor region between ends of surfaces of said first and second semiconductor regions being defined as a channel region, a value $W_U$ per unit area of a width of said channel region, which is defined as a length along opposite ends of the surfaces of said first and second semiconductor regions, satisfying $140 \text{ cm}^{-1} \leq W_U \leq 280 \text{ cm}^{-1}$;

forming an insulation film on said channel region;

forming a control electrode on said insulation film;

forming a first main electrode on said first and second semiconductor regions; and forming a second main electrode on said second major surface of said first semiconductor layer.

4. An insulated gate bipolar transistor having a breakdown voltage of about 1000 to 1500 volts, fabricated by a method comprising the steps of:

preparing a first conductivity type first semiconductor layer having first and second major surfaces;

forming a second conductivity type second semiconductor layer on said first major surface of said first semiconductor layer;

forming a first conductivity type first semiconductor region selectively in a surface of said second semiconductor layer;

forming a second conductivity type second semiconductor region selectively in a surface of said first semiconductor region, a portion of said first semiconductor region, in a peripheral portion of said first semiconductor region, near a portion of the surface of said first semiconductor region between ends of surfaces of said first and second semiconductor regions being defined as a channel region, a value $W_U$ per unit area of a width of said channel region, which is defined as a length along opposite ends of the surfaces of said first and second semiconductor regions, satisfying $70 \text{ cm}^{-1} \leq W_U \leq 150 \text{ cm}^{-1}$;

forming an insulation film on said channel region;

forming a control electrode on said insulation film;

forming a first main electrode on said first and second semiconductor regions; and forming a second main electrode on said second major surface of said first semiconductor layer.

5. An insulated gate bipolar transistor, fabricated by a method comprising the steps of:

preparing a first conductivity type first semiconductor layer having first and second major surfaces;

forming a second conductivity type second semiconductor layer on said first major surface of said first semiconductor layer;

forming an insulation film on said second semiconductor layer;

forming a control electrode on said insulation film;

selectively removing said control electrode and said insulation film to open a window;

implanting first conductivity type impurities in said second semiconductor layer through said window to form a first conductivity type first semiconductor region selectively in a surface of said second semiconductor layer;

selectively implanting second conductivity type impurities in said first semiconductor region to form a plurality of second conductivity type second semiconductor regions selectively in a surface of said first semiconductor region, a portion of said first semiconductor region near a portion of the surface of said first semiconductor region under said gate electrode between outer ends of surfaces of said first and second semiconductor regions being defined as a channel region, a distance D between two of said second semiconductor regions formed in a direction perpendicular to a channel length direction and the length of L of said channel region which is defined as a distance between the outer ends of the surfaces of said first and second semiconductor regions satisfying $D > 2L$;

forming a first main electrode on said first and second semiconductor regions; and forming a second main electrode on said second major surface of said first semiconductor layer;

wherein a value $E_c$ per unit area of a calorific energy of said insulated gate bipolar transistor satisfies $E_c < 5 \text{ Joules/cm}^2$.

6. An insulated gate bipolar transistor fabricated in accordance with the method of claim 5, wherein said step of forming a second conductivity type second semiconductor layer comprises the steps of preparing a second conductivity type second semiconductor layer and attaching said second semiconductor layer to said first semiconductor layer.

* * * * *